(12) United States Patent
Kimbel

(10) Patent No.: US 8,524,000 B2
(45) Date of Patent: Sep. 3, 2013

(54) PULLING ASSEMBLIES FOR PULLING A MULTICRYSTALLINE SILICON INGOT FROM A SILICON MELT

(75) Inventor: Steven L. Kimbel, St. Charles, MO (US)

(73) Assignee: MEMC Singapore Ptd. Ltd., Singapore (SG)

( * ) Notice: Subject to any disclaimer, the term of this patent is extended or adjusted under 35 U.S.C. 154(b) by 923 days.

(21) Appl. No.: 12/646,350

(22) Filed: Dec. 23, 2009

(65) Prior Publication Data

US 2011/0002819 A1 Jan. 6, 2011

Related U.S. Application Data

(60) Provisional application No. 61/141,567, filed on Dec. 30, 2008.

(51) Int. Cl.
*C30B 15/32* (2006.01)

(52) U.S. Cl.
USPC .............. 117/13; 117/18; 117/213; 117/214; 117/215

(58) Field of Classification Search
USPC ............................ 117/13, 18, 213, 214, 215
See application file for complete search history.

(56) References Cited

U.S. PATENT DOCUMENTS

| | | | |
|---|---|---|---|
| 4,352,785 A | 10/1982 | Schellin | |
| 5,593,498 A | 1/1997 | Kimbel et al. | |
| 5,766,341 A | 6/1998 | Kimbel et al. | |
| 5,797,990 A | 8/1998 | Li | |
| 5,851,287 A | 12/1998 | Soeta | |
| 5,932,007 A | 8/1999 | Li | |
| 5,942,032 A | 8/1999 | Kim et al. | |
| 6,045,610 A | 4/2000 | Park et al. | |
| 6,139,630 A | 10/2000 | Fujiyama et al. | |
| 6,183,553 B1 | 2/2001 | Holder et al. | |
| 6,482,263 B1 | 11/2002 | Ferry et al. | |
| 6,797,062 B2 | 9/2004 | Ferry et al. | |
| 7,125,450 B2 | 10/2006 | Lu et al. | |
| 7,217,320 B2 | 5/2007 | Kim et al. | |
| 2007/0193501 A1 | 8/2007 | Ono et al. | |
| 2008/0152805 A1 | 6/2008 | Boyle et al. | |

FOREIGN PATENT DOCUMENTS

| | | |
|---|---|---|
| CN | 1337476 A | 2/2002 |
| KR | 1020060073854 | 6/2006 |
| WO | 02092885 A1 | 11/2002 |

OTHER PUBLICATIONS

Office Action dated Feb. 6, 2012 in related U.S. Appl. No. 12/646,303, filed Dec. 23, 2009.
International Search Report mailed on Mar. 12, 2010 regarding PCT/US2009/069488 filed on Dec. 23, 2009, 2 pages.
Taishi et al., "Influence of crystalline defects in Czochralski-grown Si multicrystal on minority carrier lifetime", Journal of Crystal Growth, May 31, 2007, vol. 306, pp. 452-457.
Hoshikawa et al., "Si multicrystals grown by the Czochralski method of multi-seeds", Journal of Crystal Growth, Jul. 10, 2007, vol. 307, pp. 466-471.
Hassler et al., Multicrystalline Silicon for Solar Cells: Process Development by Numerical Simulation, Advanced Materials, Dec. 2001, vol. 13, No. 23, pp. 1815-1819.
International Search Report mailed on May 4, 2010 regarding PCT/US2009/069488 filed on Dec. 23, 2009, 1 page.

(Continued)

*Primary Examiner* — Bob M Kunemund
(74) *Attorney, Agent, or Firm* — Armstrong Teasdale LLP

(57) ABSTRACT

Methods for producing multicrystalline silicon ingots by use of a Czochralski-type crystal puller and pulling assemblies that include a plurality of seed crystals for pulling multicrystalline silicon ingots.

21 Claims, 10 Drawing Sheets

(56) References Cited

OTHER PUBLICATIONS

Taishi et al., "Behavior of dislocations due to thermal shock in B-doped Si seed in Czochralski Si crystal growth", Journal of Crystal Growth, Mar. 7, 2002, vol. 241, pp. 277-282.

Final Office Action dated Aug. 14, 2012 in Co-Owned U.S. Appl. No. 12/646,303.

Engineering in a Changing Economy, IEEE, Proceedings of 1976 IEEE Southeastcon, Multi-Crystal Silicon Solar Cells, Lin et al., p. 147-149 (1976).

Co-owned U.S. Appl. No. 12/646,303, filed Dec. 23, 2009.

Luque et al., Handbook of Photovoltaic Science and Engineering, p. 211-213 (2003).

PULLING ASSEMBLIES FOR PULLING A MULTICRYSTALLINE SILICON INGOT FROM A SILICON MELT

CROSS-REFERENCE TO RELATED APPLICATION

This application claims the benefit of U.S. Provisional Application No. 61/141,567, filed Dec. 30, 2008, which is incorporated herein by reference in its entirety.

BACKGROUND

The field of the invention relates generally to the production of multicrystalline silicon and, more particularly, to the production of multicrystalline silicon by pulling a multicrystalline silicon ingot.

Conventional photovoltaic cells used for the production of solar energy utilize multicrystalline silicon. Multicrystalline silicon is conventionally produced in a directional solidification (DS) process in which silicon is melted in a crucible and directionally solidified in a separate or in the same crucible. The solidification of the ingot is controlled such that molten silicon is fed to the solidifying front of the casting. The multicrystalline silicon produced in such a manner is an agglomeration of crystal grains with the orientation of the grains relative to each other being random due to the high density of heterogeneous nucleation sites at the crucible wall. Multicrystalline silicon is generally the preferred silicon source for photovoltaic cells rather than single crystal silicon due to its lower cost resulting from higher throughput rates as compared to single crystal silicon production.

Multicrystalline silicon ingots grown by the DS process often have a reduced median grain size in the portion of the ingot near the crucible in which they are grown due to the many nucleation points at the crucible surface. This reduced median grain size and the solid-state diffusion of impurities from the crucible wall cause a reduction in the minority carrier lifetime in this region detrimentally affecting the resulting cells' efficiency. Accordingly, this portion of the ingot is generally not used to produce solar cells but rather is recycled by utilization in subsequent silicon charges.

Further, a substantial portion of a silicon ingot grown by the DS process near the top portion of the ingot cannot be used for device fabrication and cannot be recycled for further use due to high impurity content in the region. This high impurity content is caused by segregation of impurities in the melt as the ingot forms. As the ingot forms, the concentration of impurities in the melt generally increases due to the relatively small segregation coefficient. The top region of the ingot is typically the last region to solidify and contains the highest concentration of impurities.

A need exists for high throughput methods for producing multicrystalline silicon ingots that do not result in a reduction in the median grain size in peripheral portions of the resulting ingot and which generally do not generate significant regions in the ingot which cannot be used for device fabrication or recycle.

BRIEF SUMMARY

One aspect of the present invention is directed to a pulling assembly constructed for holding a plurality of seed crystals for pulling a growing ingot upward from a silicon melt. The pulling assembly includes a chuck and a plurality of seed crystals connected to the chuck.

Another aspect of the present invention is directed to an ingot puller for growing a silicon ingot from a silicon melt. The ingot puller includes a housing and a pulling mechanism for pulling a growing ingot upward from a silicon melt held within a crucible. The pulling mechanism includes a pulling assembly that includes a plurality of seed crystals and a chuck constructed for holding the seed crystals and the ingot grown on the seed crystal from the silicon melt.

A further aspect of the present invention is directed to an ingot puller for growing a silicon ingot from a silicon melt. The ingot puller has a pulling mechanism for pulling a growing ingot upward from a silicon melt held within a crucible. The pulling mechanism includes a pulling assembly that includes a mounting bracket that (1) is circular in shape or (2) has at least two legs.

Various refinements exist of the features noted in relation to the above-mentioned aspects of the present invention. Further features may also be incorporated in the above-mentioned aspects of the present invention as well. These refinements and additional features may exist individually or in any combination. For instance, various features discussed below in relation to any of the illustrated embodiments of the present invention may be incorporated into any of the above-described aspects of the present invention, alone or in any combination.

BRIEF DESCRIPTION OF THE DRAWINGS

Corresponding reference characters indicate corresponding parts throughout the drawings.

DETAILED DESCRIPTION

Figure 1:
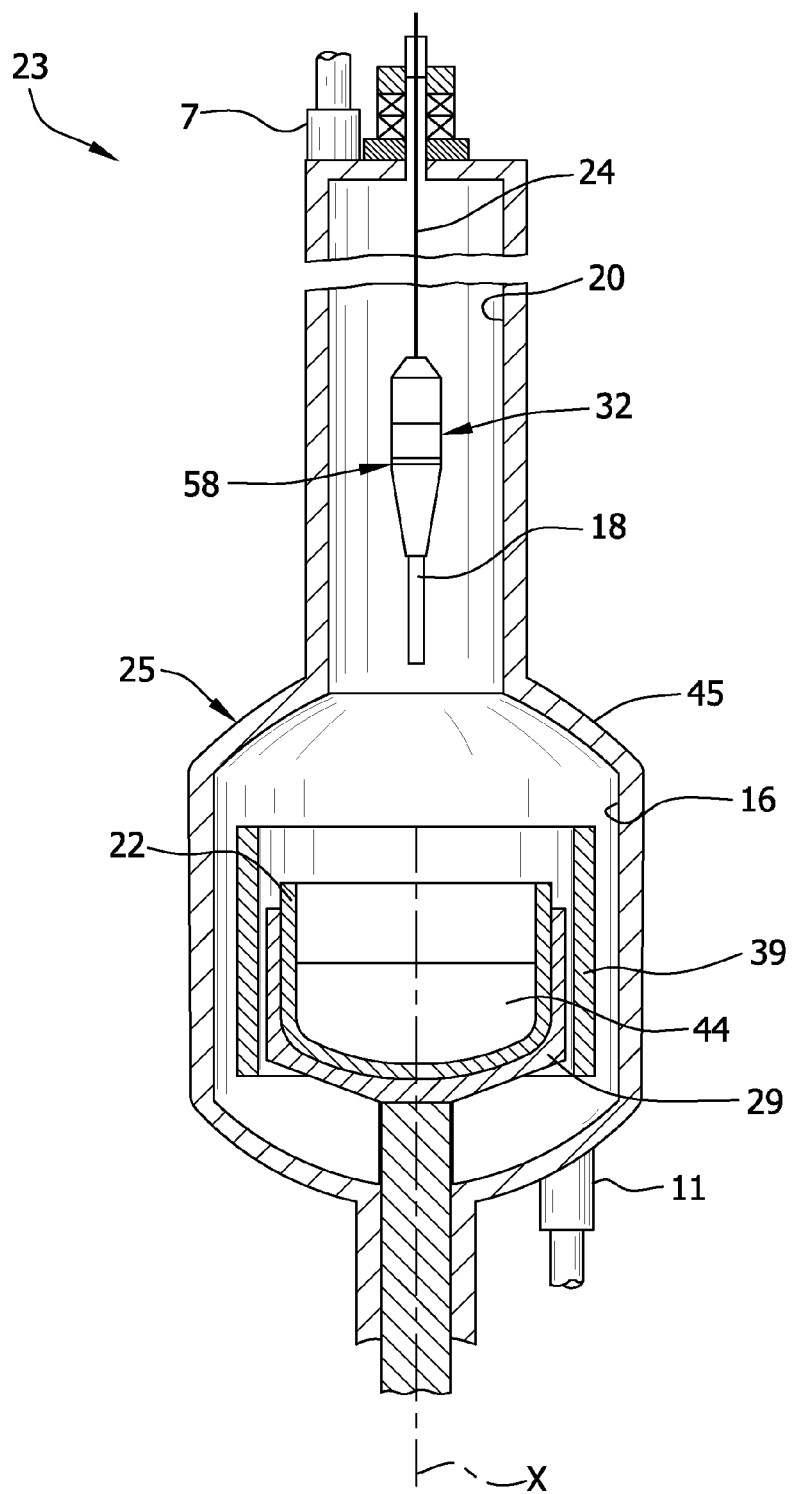
FIG. 1 is a cross section of a Czochralski-type crystal puller.

Referring now to the drawings and in particular to FIG. 1, an ingot puller for use in accordance with the methods of the present invention of the type used to grow a multicrystalline silicon ingot according to the Czochralski method is designated by the reference numeral 23. The ingot puller 23 includes a housing 25 that defines a crystal growth chamber 16 and a pull chamber 20 having a smaller transverse dimension than the growth chamber. The growth chamber 16 has a generally dome shaped upper wall 45 transitioning from the growth chamber 16 to the narrowed pull chamber 20. The ingot puller 23 includes an inlet port 7 and an outlet port 11 which may be used to introduce and remove selective ambients to and from the housing 25 during crystal growth.

A crucible 22 within the ingot puller 23 contains a silicon melt 44 from which a multicrystalline silicon ingot is drawn. The silicon melt 44 is obtained by melting polycrystalline silicon charged to the crucible 22. The crucible 22 is mounted on a turntable 29 for rotation of the crucible about a central longitudinal axis X of the ingot puller 23. In this regard, it should be understood that in certain embodiments, the crucible is not rotated. The crucible 22 is also capable of being raised within the growth chamber 16 to maintain the surface of the melt 44 at a generally constant level as the ingot is grown. An electrical resistance heater 39 surrounds the crucible 22 for melting the silicon charge to produce the melt 44. The heater 39 is controlled by a control system (not shown) so that the temperature of the melt 44 is precisely controlled throughout the pulling process. Insulation (not shown) surrounding the heater 39 may reduce the amount of heat lost through the housing 25. The ingot puller 23 may also include a heat shield assembly (not shown) above the melt surface for shielding the ingot from the heat of the crucible 22 to increase the axial temperature gradient at the solid-melt interface as more fully described in U.S. Pat. No. 6,797,062 which is incorporated herein by reference.

A pulling mechanism (not shown) is attached to a pull wire 24 that extends down from the mechanism. The mechanism is capable of raising and lowering the pull wire 24. The ingot puller 23 may have a pull shaft rather than a wire, depending upon the type of puller. The pull wire 24 terminates in a pulling assembly 58 that includes a seed crystal chuck 32 which holds a seed crystal 18 used to grow the multicrystalline silicon ingot. In growing the ingot, the pulling mechanism lowers the seed crystal 18 until it contacts the surface of the silicon melt 44. Once the seed crystal 18 begins to melt, the pulling mechanism slowly raises the seed crystal up through the growth chamber 16 and pull chamber 20 to grow the monocrystalline or multicrystalline ingot. The speed at which the pulling mechanism rotates the seed crystal 18 and the speed at which the pulling mechanism raises the seed crystal (i.e., the pull rate v) are controlled by the control system. The general construction and operation of the ingot puller 23, except to the extent explained more fully below, is conventional and known by those of ordinary skill in the art.

In some embodiments, the ingot puller 23 is suitably configured to prepare silicon ingots that are cylindrical and with a nominal diameter of about 150 mm and, in other embodiments, with a nominal diameter of about 200 mm and, in yet other embodiments, a nominal diameter of about 300 mm. In some embodiments, the ingot puller 23 is suitably configured to prepare silicon ingots with a nominal diameter of at least about 300 mm and even silicon ingots with a nominal diameter of about 450 mm or more. It should be understood that ingots may be pulled in a manner such that ingots of a shape other than cylindrical (e.g., rectangular or square) may be produced. In this regard, the largest nominal dimension of the ingot (not including the length of the ingot or, stated differently, the longest nominal dimension of the radial cross-section) may be the same as listed for cylindrical ingots. Alternatively or in addition, the ingot puller 23 is suitably configured to prepare silicon ingots with a largest nominal dimension (not including the length) of from about 50 mm to about 500 mm or from about 100 mm to about 350 mm.

The hot zone of the ingot puller 23 may be configured to provide a predominantly axial flow of heat from the ingot puller. The hot zones of conventional crystal pullers for pulling single crystal silicon typically are configured to provide axial and radial cooling. A predominantly axial heat flow reduces the radial temperature gradient within the ingot as compared to conventional Czochralski pulling techniques thereby reducing the cooling stress in the ingot. The ingot puller hot zone may include a relatively thick heat shield assembly above the melt surface with limited insulation above the reflector to cause predominant axial heat flow. Suitable heat shield assemblies are show in U.S. Pat. Nos. 6,482,263 and 7,217,320, both of which are incorporated herein by reference. Crucible rotation modulation as disclosed in U.S. Pat. Nos. 5,766,341 and 5,593,498 and crucible rotation as disclosed in U.S. Pat. No. 7,125,450, all of which are incorporated herein by reference, may be utilized to affect the temperature gradient within the ingot.

In one embodiment, the ingot is annealed by heating the ingot to a temperature from about 1000° C. to about 1300° C. for at least about one hour to reduce residual stress within the ingot. In another embodiment, the ingot is annealed by heating to a temperature from about 1000° C. to about 1300° C. for at least about two hours to reduce residual stress within the ingot.

The hot zone of the ingot puller may be configured to reduce iron contamination near the edge of the ingot by utilizing a protective coating(s) on the hot zone components, particularly the upper hot zone components, as disclosed in U.S. Pat. No. 6,183,553, which is incorporated herein by reference. Optionally, the purity of the upper hot zone components may be controlled and/or the flow of process gas introduced to and from the ingot puller 23 may be controlled to reduce iron contamination. The flow of process gas may be increased relative to conventional Czochralski techniques to increase dilution in the gas phase. Gas flows required to achieve this effect depend on the particular hot zone employed and may be determined experimentally.

In one embodiment, the hot zone of the ingot puller is configured to be segmented (e.g., insulation is in tiles instead of a continuous piece) to reduce the cost of purification of the hot zone components.

A plurality of seed crystals, rather than one seed crystal as described above, may be utilized to pull the ingot from the silicon melt. In one embodiment, at least 2 seeds are used to pull the ingot and, in another embodiment, at least about 4 seeds. In other embodiments, at least about 10 seeds are used, at least about 50 seeds, at least about 100 seeds or at least about 200 seeds. In yet further embodiments, at least about 300 seeds, about 350 seeds or even at least about 400 seeds are used to pull the silicon ingot. In other embodiments, from about 4 seeds to about 400 seeds are used, from about 10 seeds to about 400 seeds, from about 50 seeds to about 400 seeds, from about 100 seeds to about 400 seeds, from about 200 seeds to about 400 seeds or even from about 300 seeds to about 400 seeds are used to pull the silicon ingot. The number of seeds used to pull the silicon ingot may be dependent on, among other things, the size of the silicon ingot to be pulled. Generally by increasing the number of seeds used to pull the ingot, the ingot achieves a constant diameter portion more quickly (i.e., the ingot has a short multiple seed cone region) as compared to pulling methods that utilize a relatively few seeds or even one seed. By maximizing the portion of the ingot that represents the constant diameter portion, the throughput of the ingot puller increases. Using multiple seeds also creates multiple nucleation points for multicrystalline crystal growth. The mismatch dislocations in the ingot may be reduced by minimizing or preferentially selecting the orientation difference among the plurality of seeds.

A multicrystalline or single crystal silicon ingot may be prepared by loading polycrystalline silicon into the crucible to form a silicon charge. The silicon charge is heated to a temperature above about the melting temperature of the charge to form a silicon melt. At least two seed crystals may be brought into contact with the silicon melt and a silicon ingot pulled up from the silicon melt.

The growth conditions of the silicon ingot may be controlled such that the silicon ingot has a multicrystalline structure. Such growth conditions may include the use of multiple seed crystals, as further described herein. For purposes of the present specification, "multicrystalline" structures such as ingots and wafers have an average nominal crystal grain size of at least about 1 mm. Polycrystalline structures have an average nominal crystal size of less than about 1 mm. The average nominal crystal grain size may be evaluated by observing the light reflectance in a wafer sliced from the silicon ingot. The crystal grains reflect the light in different directions due to the difference in crystal orientation between grains. The nominal distance between grain boundaries may be evaluated across the wafer and averaged.

The multicrystalline ingot may be prepared by loading polycrystalline silicon into a crucible to form a silicon charge. The silicon charge is heated to a temperature above about the melting temperature of the charge to form a silicon melt. A seed crystal is lowered to contact the silicon melt and a silicon ingot is drawn up from the silicon melt, wherein growth conditions of the ingot are controlled to produce a multicrystalline silicon ingot.

In another example, the growth conditions may be controlled such that the temperature gradient is sufficiently low to prevent dislocation multiplication. The proper temperature gradient depends on, among other factors, the hot zone and the ingot size. The proper temperature gradient may be found experimentally or by modeling. In one example, the temperature gradient is maintained below 0.2° C./mm (e.g., less than 50° C. over a 250 mm ingot).

In one embodiment, the growth velocity of the growing multicrystalline silicon ingot is controlled to be from about 0.3 mm/min to about 2.0 mm/min. In another embodiment, the growth rate is controlled to be from about 1.0 mm/min to about 2.0 mm/min. In one embodiment, the growth rates are selected to produce an ingot with vacancies being the predominant intrinsic point defect to minimize interstitial defects. In another embodiment, the growth rates are selected to produce an ingot with interstitials being the predominant intrinsic point defect and wherein the ingot growth rate exceeds the dislocation velocities near the solid-melt interface. Higher seed lifts may be used to maximize productivity, but are limited by practical ingot distortion limits.

In one embodiment, the seed rotation is zero (i.e., the seed is not rotated) and the upper hot zone components are active and of a square cross-section in order to achieve an ingot with a square cross-section. These conditions are different from conventional Czochralski crystal growth methods.

Figure 2:
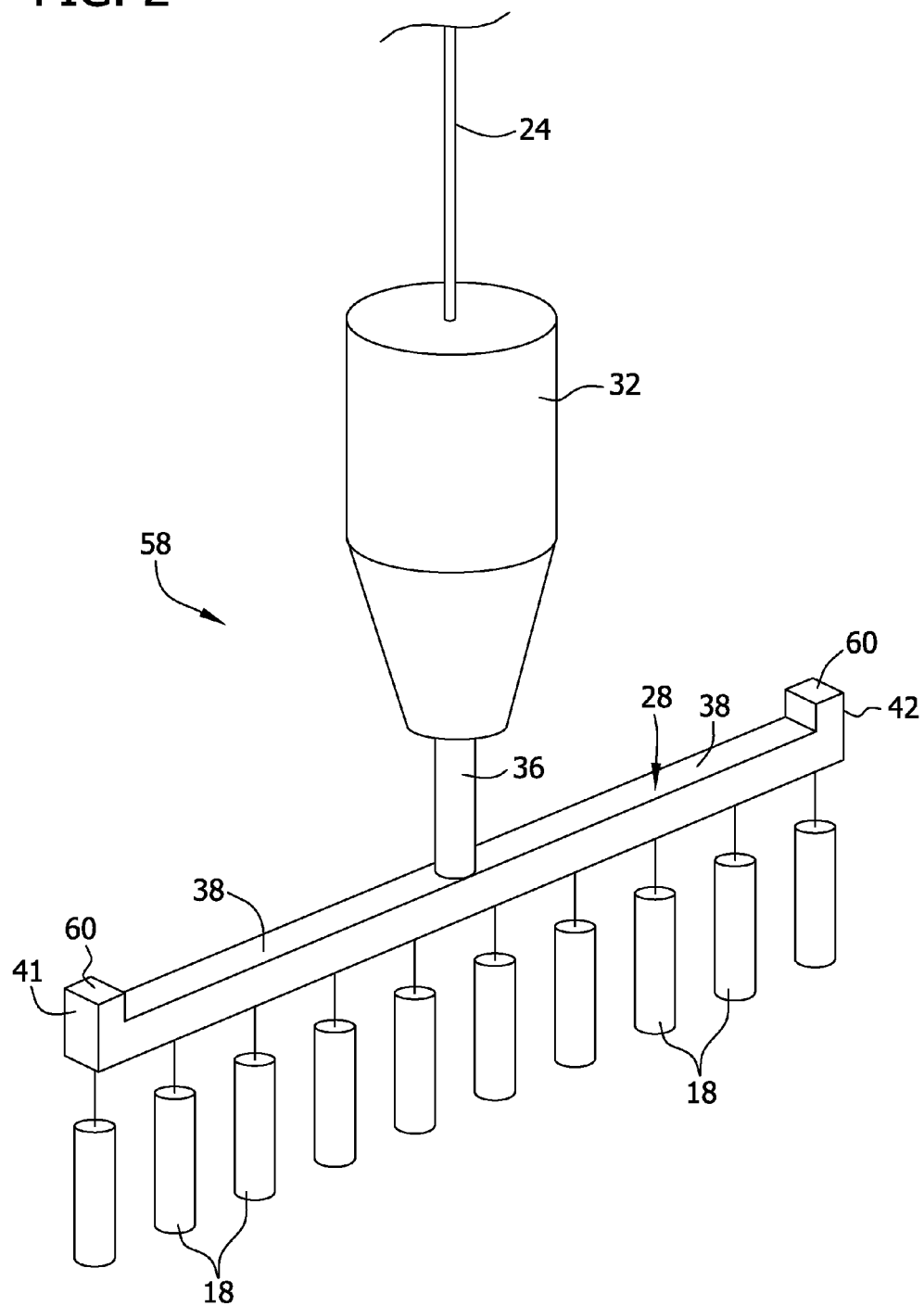
FIG. 2 is a perspective of a pulling assembly according to one embodiment of the present invention.

Referring now to FIG. 2, in one embodiment, the pulling assembly 58 used to pull the ingot from the melt includes a chuck 32 with multiple seed crystals 18 attached thereto (or suspended therefrom). By using multiple seeds, the formed ingot does not include a tapered seed cone that is a characteristic of silicon ingots pulled using conventional apparatus that include a single seed but, rather, includes multiple shorter seed cones. Conventional pulling techniques for growing single crystal silicon ingots include only one seed as additional seeds would result as nucleation points for multiple crystals. The seeds 18 are attached to a mounting bracket 28. The mounting bracket 28 is attached to the chuck 32 by a suspension rod 36; however, the bracket may be attached directly to the chuck 32, or may be attached in other ways without departing from the scope of the present invention. The mounting bracket 28 includes two radially symmetric legs 38 that extend from the suspension rod 36 and that include respective ends 41, 42. In one embodiment, the distance between the ends 41, 42 is at least about 75% of the diameter of the ingot pulled from the melt and, in other embodiments, is at least about 85%, at least about 95% and even at least about 100% of the diameter of the ingot pulled from the melt. As shown in FIG. 2, each leg has five seeds attached to it. Each leg may have more or less than five seeds attached to it without departing from the scope of the present invention.

The mounting bracket 28, suspension rod 36 and chuck 32 may be constructed of graphite, silicon carbide coated with graphite, silicon, silicon carbide or high temperature refractory metals. Silicon carbide coated with graphite may be used due to lower cost, strength and ease of fabrication.

Figure 3:
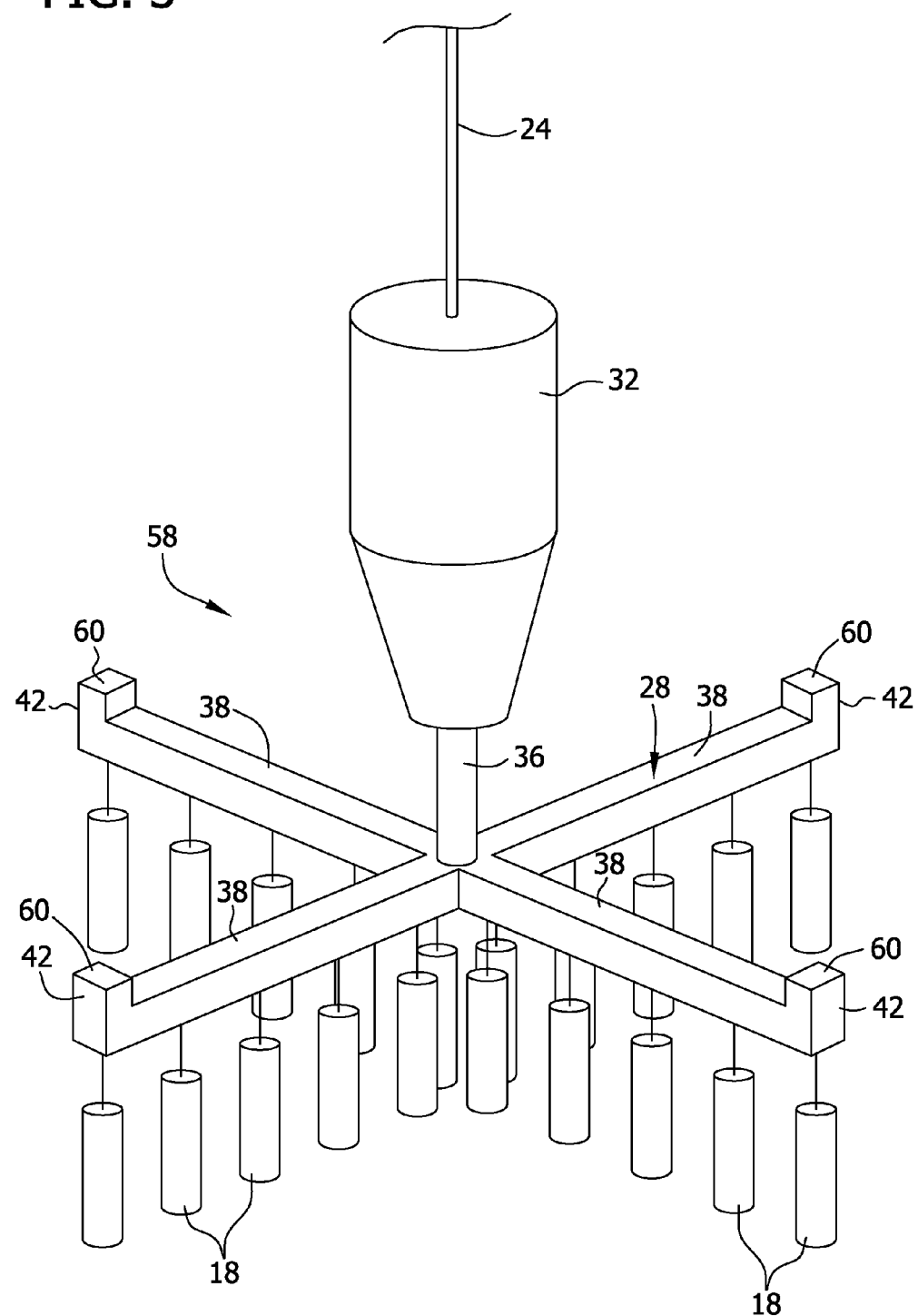
FIG. 3 is a perspective of a pulling assembly according to a second embodiment of the present invention.
Figure 4:
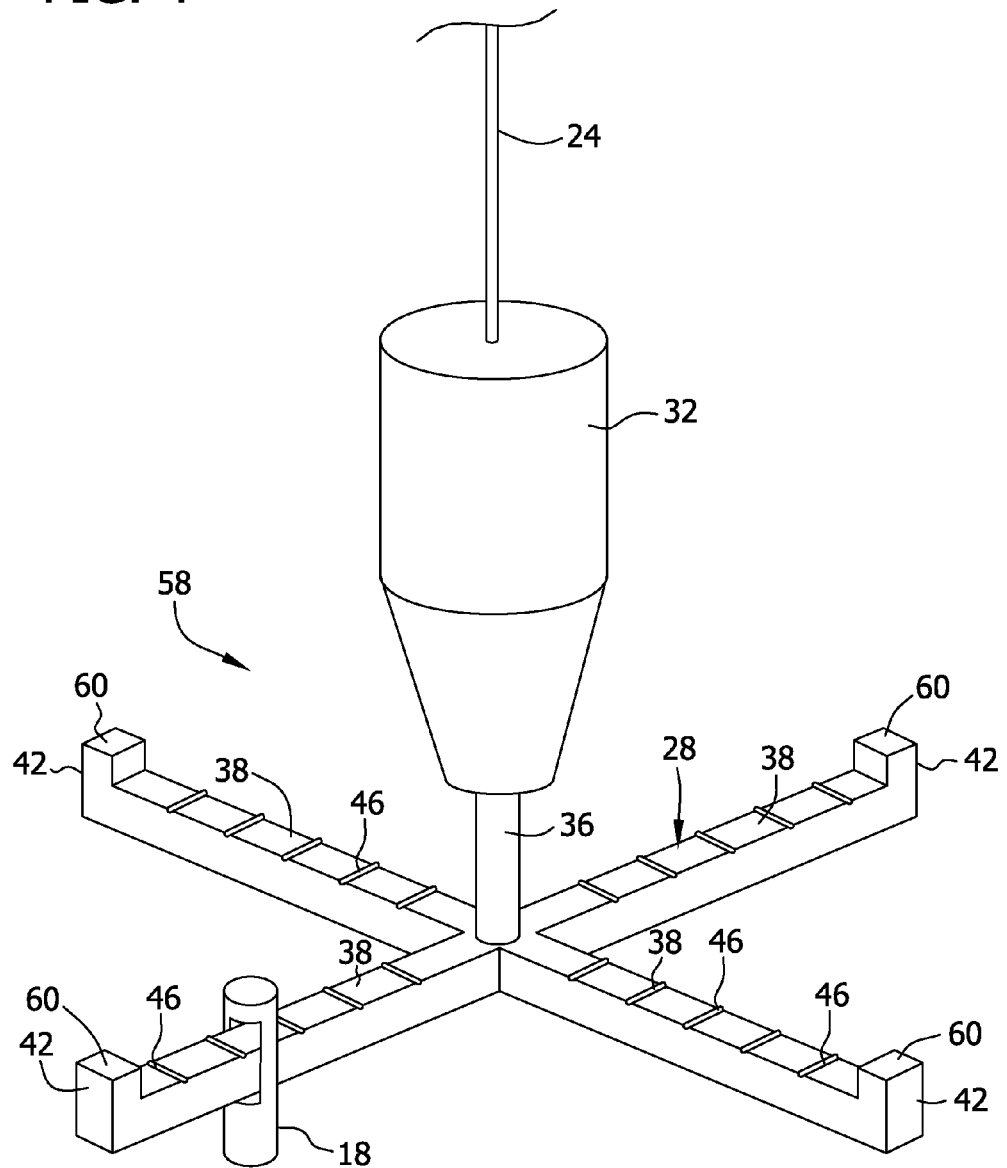
FIG. 4 is a perspective of the pulling assembly of FIG. 3 with a plurality of frets being shown.
Figure 5:
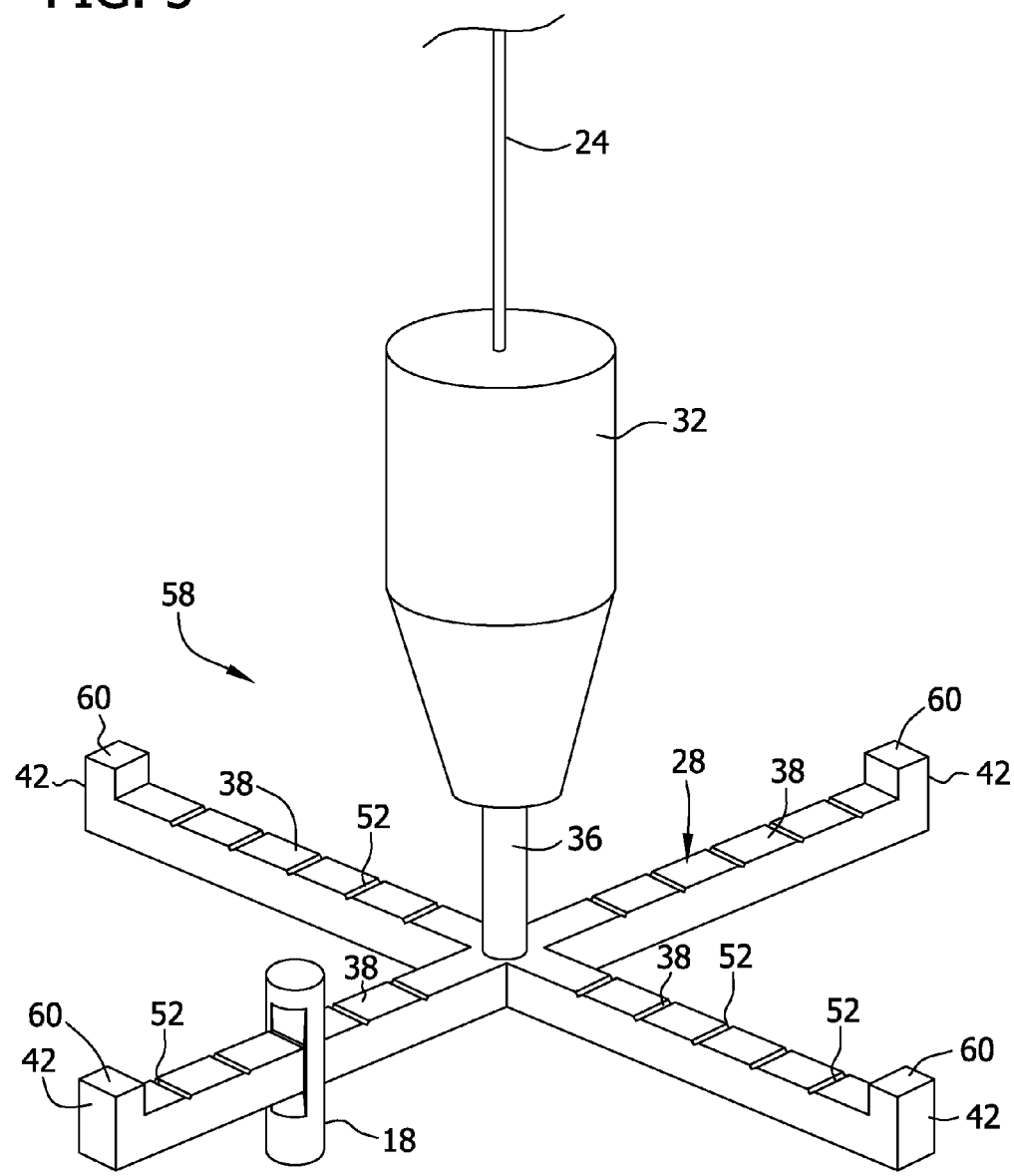
FIG. 5 is a perspective of the pulling assembly of FIG. 3 with a plurality of grooves being shown.

Referring now to FIG. 3, the mounting bracket 28 may include more than two legs. As shown in FIGS. 3-5 the mounting bracket includes four legs 38 with each leg being radially symmetric to a second leg.

As the silicon ingot emerges from the hot zone of the ingot puller and begins to cool, the ingot radially contracts. In one embodiment of the present invention, the crystal seeds 18 are attached to the mounting bracket 28 in an arrangement that allows the seeds to move laterally to allow for thermal contraction of the ingot. For instance, the seed crystals 18 shown in FIGS. 2, 3 and 6 may be attached to a wire 60 (FIG. 7) that terminates in a ball 62. The seed crystals 18 may be attached to the mounting bracket 28 as a ball and socket joint to allow lateral movement of the seeds. Alternatively, the seeds may be wired directly to the mounting bracket 28 using refractory metal wires.

Figure 8:
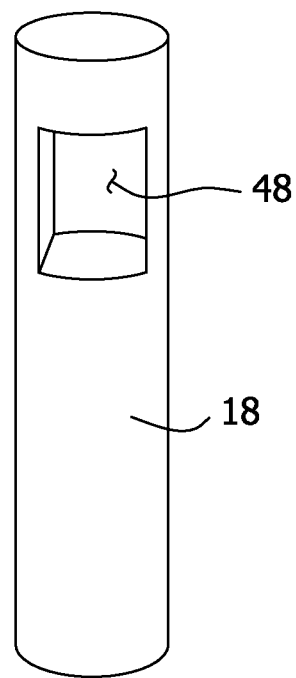
FIG. 8 is a perspective of a seed crystal according to a second embodiment of the present invention.

Alternatively and as shown in FIG. 4, the mounting bracket 28 may include a number of frets 46 that bound the movement of the seeds 18. Only one seed is shown in FIG. 4 for illustration purposes. The seeds 18 include an opening 48 (FIG. 8) that allows the seeds to be seated on the mounting bracket 28. The opening 48 is sufficiently large to allow lateral movement of the seed as the ingot cools. The frets 46 restrict movement of the seeds 18 such that each seed stays within a pair of frets as the seeds are lowered to contact the melt and as the ingot is pulled from the melt. The mounting bracket 28 may include upward protrusions 60 near the ends 42 of the legs 38 that help to limit the movement of the seeds 18 at the ends of the legs. Alternatively, the upward protrusions 60 may be replaced by frets. The mounting bracket 28 may not include upward protrusions 60 without departing from the scope of the present invention.

Figure 9:
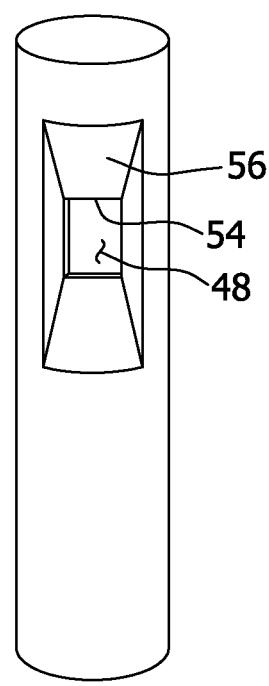
FIG. 9 is a perspective of a seed crystal according to a third embodiment of the present invention.

Alternatively and as shown in FIG. 5, the mounting bracket 28 may include a plurality of grooves 52. In this embodiment, the seeds 18 include an opening 48 (FIG. 9). The seed includes a tapered portion 56 that tapers inwardly toward a ridge 54. The ridge 54 may be seated in a groove 52 of the mounting bracket 28 to allow for lateral movement of the seed as the ingot cools. Only one seed is shown in FIG. 5 for illustration purposes.

Figure 6:
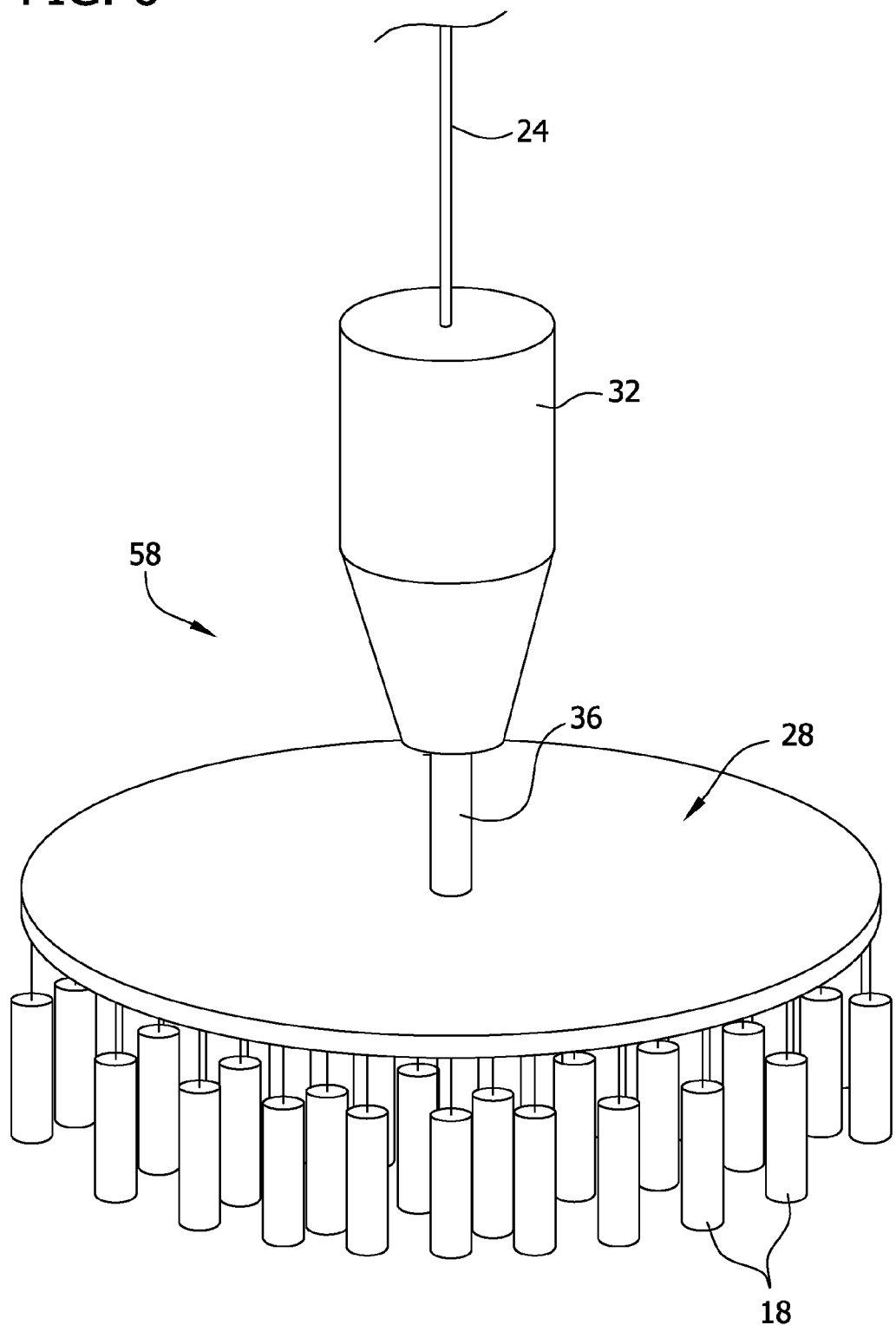
FIG. 6 is a perspective of a pulling assembly according to a third embodiment of the present invention.
Figure 7:
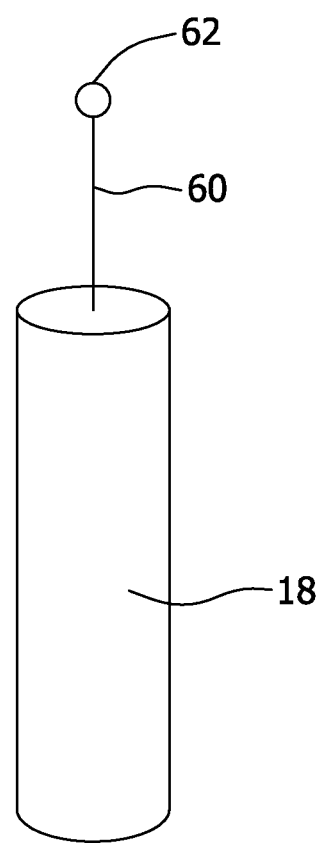
FIG. 7 is a perspective of a seed crystal according to one embodiment of the present invention.

Referring now to FIG. 6, according to one embodiment of the present invention, the mounting bracket 28 is circular in shape. The diameter of the bracket may be at least about 75% of the diameter of the ingot pulled from the melt and, in other embodiments, is at least about 85%, at least about 95% and even at least about 100% of the diameter of the ingot pulled from the melt.

The silicon ingot pulled from the melt defines a cross-sectional area. For example, for silicon ingots about 450 mm in diameter, the cross-sectional area is about 1590 $cm^2$. In one embodiment, the number of seed crystals attached to the chuck and used to contact the silicon melt to pull the ingot is at least about 1 seed crystal per 400 $cm^2$ of ingot cross sectional area and in another embodiment is at least about 1 seed crystal per 100 cm$^2$ of ingot cross sectional area.

In another embodiment, the number of seed crystals that contact the silicon melt is at least about 10 seed crystals per 100 cm$^2$ of ingot cross sectional area and, in other embodiments, at least about 20 seed crystals per 100 cm$^2$ of ingot cross sectional area or even at least about 30 seed crystals per 100 cm$^2$ of ingot cross sectional area. In other embodiments, the number of seed crystals that contact the silicon melt is from about 1 crystal per 400 cm$^2$ of ingot cross sectional area to about 30 crystals per 100 cm$^2$ of ingot cross sectional area, from about 1 crystal per 400 cm$^2$ of ingot cross sectional area to about 20 crystals per 100 cm$^2$ of ingot cross sectional area or from about 10 crystal per 100 cm$^2$ of ingot cross sectional area to about 30 crystals per 100 cm$^2$ of ingot cross sectional area. In one embodiment, the seed crystals are arranged in a circular pattern or in a regular geometric array.

In one embodiment, the growth conditions are controlled such that the silicon ingot has an average nominal crystal grain size of at least 1 mm and, in another embodiment, from about 1 mm to about 25 mm. In another embodiment, the silicon ingot has an average nominal diameter of from about 1 mm to about 15 mm and even from 1 mm to about 10 mm. In another embodiment, the average nominal crystal grain size of the silicon ingot is from about 5 mm to about 25 mm, from about 5 mm to about 15 mm or from about 5 mm to about 10 mm.

In some embodiments, the multicrystalline silicon ingot is cylindrical and has a nominal diameter of about 150 mm and, in other embodiments, a nominal diameter of about 200 mm and, in yet other embodiments, a nominal diameter of about 300 mm. In some embodiments, the silicon ingot has a nominal diameter of at least about 300 mm and even a nominal diameter of about 450 mm. In other embodiments, the ingot is of a shape other than cylindrical (e.g., rectangular or square) and the multicrystalline silicon ingot has a largest nominal dimension (not including the length) as stated above for cylindrical ingots and/or a largest nominal dimension of from about 50 mm to about 500 mm or from about 100 mm to about 350 mm.

The silicon ingot may be annular in shape as with typical Czochralski methods. A square ingot may be pulled from the silicon melt by not rotating the seed and by using upper hot zone components designed to provide a high radial melt gradient. A high radial melt gradient may be achieved by use of heavy insulation or by use of active elements such as heaters.

Figure 10:
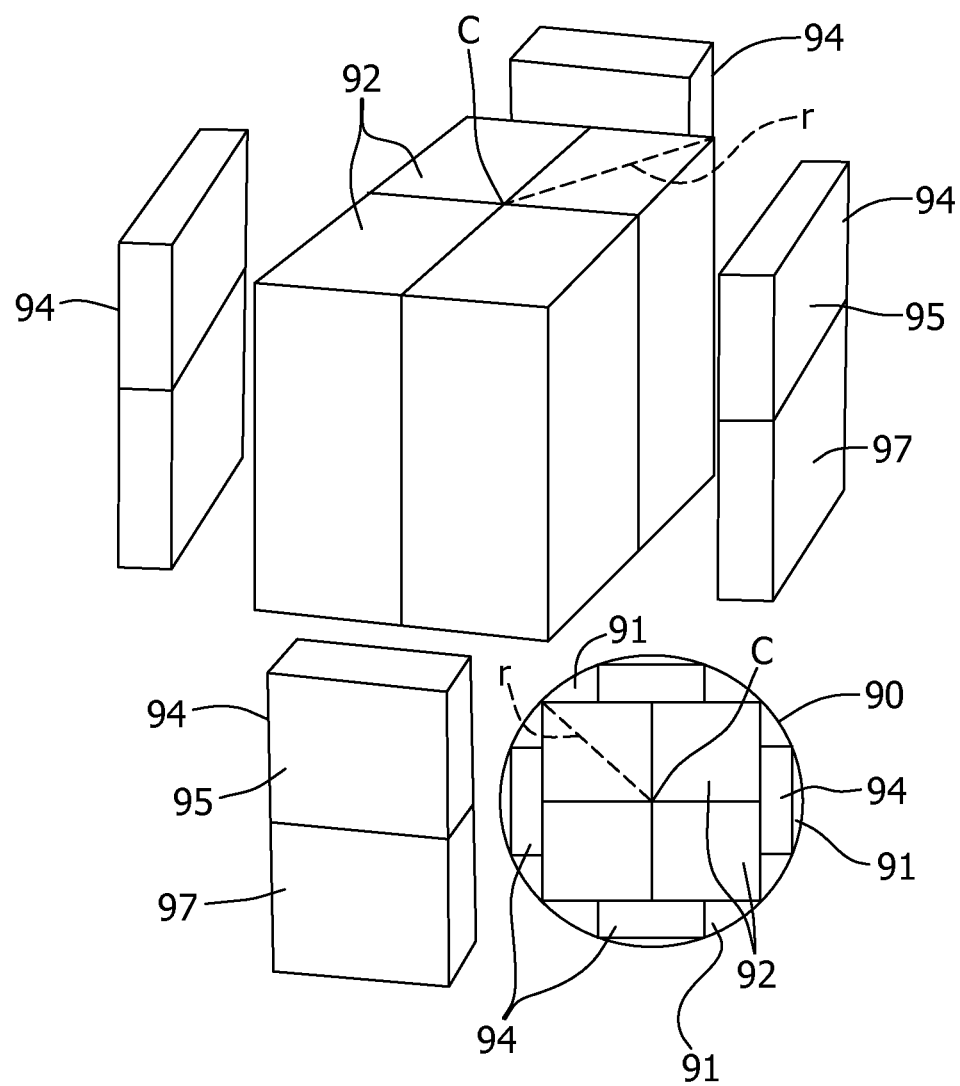
FIG. 10 is a schematic illustrating a pattern for cropping a right circular silicon ingot according to one embodiment of the present invention.

The multicrystalline silicon ingot may be cropped in a manner that maximizes the use of material for solar cell manufacture. Particularly, the ingot may be cropped to form square or rectangular ingot segments that may be sliced into square or rectangular wafers that are conventionally produced in solar cell manufacturing operations. One suitable cropping pattern for use in cropping a cylindrical ingot is shown in FIG. 10. The constant diameter portion of the ingot 90 is cropped to form four central ingot segments 92. Each segment 92 extends from about the center C of the ingot to the circumferential side or, stated differently, the diagonal length of the cross-section is substantially equal to the radius r of the ingot. The constant diameter portion of the ingot 90 is also cropped to form four peripheral ingot segments 94. Each peripheral ingot segment 94 is cropped from a portion of the ingot 90 adjacent to two of the central ingot segments 92. The peripheral ingot segments 94 extend to the circumferential side of the ingot 90 so as to minimize the size of wasted portions 91. Each radial ingot segment 94 may be further divided into a first section 95 and a second section 97. Methods for cropping ingots are well known by those skilled in the art and include, for example, use of a wire saw to cut the ingot into its various segments 92, 94 and sections 95, 97. In one embodiment, the silicon ingot is cropped in a configuration to produce hexagonal solar cells. Other cropping patterns may be used without departing from the scope of the present invention.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above apparatus and methods without departing from the scope of the invention, it is intended that all matter contained in the above description and shown in the accompanying figures shall be interpreted as illustrative and not in a limiting sense.

What is claimed is:

1. A pulling assembly constructed for holding a plurality of seed crystals for pulling a growing ingot upward from a silicon melt, the pulling assembly comprising a chuck, a mounting bracket and a plurality of seed crystals attached to the mounting bracket, the mounting bracket being connected to the chuck, the seed crystals being attached to the mounting bracket at a joint to allow for lateral movement of the seed crystals as the silicon ingot is withdrawn from the silicon melt and cools.

2. A pulling assembly as set forth in claim 1 further comprising a suspension rod attached to the chuck, wherein the mounting bracket is attached to the suspension rod.

3. A pulling assembly as set forth in claim 1 wherein the mounting bracket includes at least two legs.

4. A pulling assembly as set forth in claim 1 wherein the mounting bracket includes at least four legs.

5. A pulling assembly as set forth in claim 1 wherein the mounting bracket is circular in shape.

6. A pulling assembly as set forth in claim 1 wherein at least 4 seed crystals are connected to the chuck.

7. A pulling assembly as set forth in claim 1 wherein at least 10 seed crystals are connected to the chuck.

8. A pulling assembly as set forth in claim 1 wherein the number of seed crystals connected to the chuck is at least about 1 seed crystal per 400 cm$^2$ of cross sectional area of the ingot the pulling assembly is configured to pull.

9. An ingot puller for growing a silicon ingot from a silicon melt, the ingot puller comprising a housing and a pulling mechanism for pulling a growing ingot upward from a silicon melt held within a crucible, the pulling mechanism comprising a pulling assembly that includes a plurality of seed crystals, a mounting bracket and a chuck constructed for holding the seed crystals and the ingot grown on the seed crystal from the silicon melt, the seed crystals being attached to the mounting bracket at a joint to allow lateral movement of the crystals as the silicon ingot is withdrawn from the silicon melt and cools.

10. An ingot puller as set forth in claim 9 wherein at least about 4 seed crystals are connected to the chuck.

11. An ingot puller as set forth in claim 9 wherein the number of seed crystals connected to the chuck is at least about 1 seed crystal per 400 cm$^2$ of cross sectional area of the ingot the pulling assembly is configured to pull.

12. An ingot puller for growing a silicon ingot from a silicon melt, the ingot puller comprising a pulling mechanism for pulling a growing ingot upward from a silicon melt held within a crucible, the pulling mechanism comprising a pulling assembly that includes a plurality of seed crystals and a mounting bracket that (1) is circular in shape or (2) has at least two legs, the seed crystals being attached to the mounting bracket at a joint to allow lateral movement of the crystals as the silicon ingot is withdrawn from the silicon melt and cools.

13. An ingot puller as set forth in claim 12 wherein the mounting bracket is circular in shape.

14. An ingot puller as set forth in claim 12 wherein the mounting bracket has at least two legs.

15. An ingot puller as set forth in claim 12 wherein the mounting bracket comprises frets connected to the legs.

16. An ingot puller as set forth in claim 12 wherein the mounting bracket comprises grooves formed in the legs.

17. An ingot puller as set forth in claim 12 wherein the mounting bracket has at least four legs.

18. A pulling assembly as set forth in claim 1 wherein the seed crystals are attached to the mounting bracket by a ball and socket joint to allow for lateral movement of the seed crystals as the silicon ingot is withdrawn from the silicon melt and cools.

19. A method as set forth in claim 1 wherein the mounting bracket has at least two legs and frets connected to the legs, the seed crystals having openings that allow the seed crystals to be mounted on the legs and between the frets to allow for lateral movement of the seed crystals as the silicon ingot is withdrawn from the silicon melt and cools.

20. A method as set forth in claim 1 wherein the seed crystals are attached to a mounting bracket having a plurality of grooves.

21. A method as set forth in claim 20 wherein each seed crystal has an opening and a tapered portion that tapers to form a ridge in the opening, the ridge being seated in a groove of the mounting bracket to allow for lateral movement of the seed crystal as the silicon ingot is withdrawn from the silicon melt and cools.

* * * * *